June 19, 1962 R. A. GUDMUNDSEN 3,040,197

JUNCTION TRANSISTOR HAVING AN IMPROVED CURRENT
GAIN AT HIGH EMITTER CURRENTS
Filed Aug. 31, 1959

RICHARD A. GUDMUNDSEN,
INVENTOR

BY Charles S. Haughey
ATTORNEY

United States Patent Office 3,040,197

Patented June 19, 1962

3,040,197

JUNCTION TRANSISTOR HAVING AN IMPROVED CURRENT GAIN AT HIGH EMITTER CURRENTS

Richard A. Gudmundsen, Santa Ana, Calif., assignor to Hughes Aircraft Company, Culver City, Calif., a corporation of Delaware Filed Aug. 31, 1959, Ser. No. 837,014
17 Claims. (Cl. 307—88.5)

This invention relates to transistor devices, and more particularly to a construction or circuit for improving the operating characteristics thereof.

Junction transistors are now well known in the art, and terminology thereof is quite settled; however, for purposes of this invention the terms emitter, base and collector will be used to refer to the respective active impurity type regions of a transistor device, the "emitter junction" and the "collector junction" will be used to refer to the junctions, respectively of the emitter and base, and of the base and collector, and the current gain of a grounded base transistor, the alpha ($\alpha$), will be used herein as $$\alpha=\left(\frac{\partial Ic}{\partial Ie}\right)Vc=\text{const.}$$

at constant collector voltage, where $Ic$ is collector current and $Ie$ is emitter current. These and other terms used herein are defined in the "Handbook of Semiconductor Electronics," first edition, published by McGraw-Hill Book Company, Inc., 1956.

The current gain, or $\alpha$, of a conventional NPN or PNP transistor has a theoretical upper limit of unity, as explained on pages 1–5 of the above noted "Handbook." The current gain of a transistor device may be limited by the efficiency with which the collector receives or utilizes charge carriers injected into the base by the emitter.

It is known that a number of charge carriers injected into the base by the emitter junction travel through the base, and by a diffusion process stray to the surface of the base where they combine with charge carriers of opposite sign and become lost. This process is called surface recombination.

It has been found that a high current the peripheral portions of the emitter junction have a higher current density than the center portions thereof. Hence, as the emitter current increases, the density of carriers collected by the peripheral portions of the collector junction will increase more rapidly than the density of those collected at the central portion.

The percentage of charge carriers lost by surface recombination will not be constant, but will increase as the emitter current increases. The loss of charge carriers tends to be the greatest between the peripheral portions of the collector junction and the peripheral portions of the emitter junction, and this loss increases with increasing current flow. Thus the current gain of the transistor decreases as the emitter current increases, and as this effect becomes appreciable it places an upper limit on the substantially linear increase of collector current with increase of emitter current, with a corresponding decrease of the alpha ($\alpha$) at high emitter currents.

Numerous attempts to overcome this undesirable effect have been made, such as making the collector junction area larger than the emitter junction area to improve the collection efficiency at the periphery of the collector.

An object of this invention is to provide a junction transistor in which the reduction of the current gain occurs at higher emitter current ranges, thus improving the efficiency with which the collector junction receives charge carriers.

Other objects of this invention in its several forms are: to provide for control of the current gain independently of the transistor geometry; to cause emission of charge carriers more uniformly over the emitter junction area, or at higher emission densities in the center than at the periphery; to locally adjust the saturation current density of the collector junction; and to reduce the effect of surface recombination on the current gain over a wide range of collector current.

In one form of the invention a transistor device is provided with means comprising a collector injector for injecting charge carriers through the central portion of the collector to the central region of the collector junction. This varies the current densities to the collector junction as a function of distance to the periphery of the collector junction. For purposes of this discussion, a "collector injector" may be defined as an extra junction in a collector biased to inject charge carriers thereinto.

In another form of the invention, the temperature of the peripheral portion of the collector junction is maintained lower than the temperature of the central portion of the collector junction. This condition will affect the emitter junction, since the current saturation density increases with temperature, and the peripheral portion will have a lower saturation current density than the warmer central portions; consequently there will be higher emission of charge carriers at the center even though the local emitter junction voltage may be higher at the periphery.

For further consideration of this invention, attention is directed to the following description and drawings of the preferred forms of the invention in which like characters are used for like elements in successive figures, and to the appended claims.

The preferred form of the invention is disclosed embodied in a so-called PNP junction type transistor wherein a collector and an emitter are provided on the opposite sides of a center base section. The transistor is preferably formed from a thin wafer of an N-type semiconductor such as silicon, doped with small amounts of an active impurity such as antimony. Normally a wafer of this nature is obtained by slicing a monocrystalline ingot of silicon grown from a melt containing antimony. Such a wafer will have so-called N-type conductivity, i.e., the charge carriers are donors of electrons.

The transistor emitter and collector possess charge carriers of a polarity which is opposite to that of the base. Thus they have so-called P-type conductivity, or the charge carriers are "holes," or acceptors of electrons, when the base is N-type. For example, they may be formed by placing alloying pellets of a material such as aluminum into preformed pockets on the opposite sides of the wafer and then heating the combination up to the melting point of the pellets. The pellets will then melt and alloy with the wafer.

Upon subsequent cooling an ohmic contact button of aluminum and a recrystallized P-type region that is fused into an N-type base are formed on each side of the wafer. The exterior of the contact button is ordinarily machined or otherwise shaped so as to be flush with the exterior of the base region. An electrical conductor or lead may be soldered or otherwise secured to the remaining emitter contact so as to form an ohmic (nonrectifying) contact therewith. This lead will thus provide a convenient means for interconnecting the emitter contact with any suitable circuitry.

Figure 1:
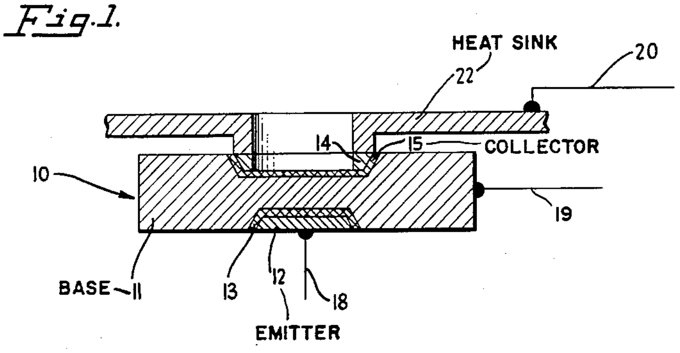
FIG. 1 is a sectional view of a transistor device according to my invention.

In FIG. 1 a semiconductor device, or transistor, 10 is shown having an N-type base 11, an emitter 13 of predominantly P-type, an emitter contact 12, and a lead 18 ohmically connected to the contact 12. A predominantly P-type collector 15 on the opposite side of the base from the emitter, and somewhat larger in area, was initially formed in the same manner as the emitter, but the central portion of the collector contact button was removed, as by etching, to form an annular collector contact 14 in ohmic contact with the collector 15. A thermal radiator in the form of a flanged ring 22 is secured to the collector contact 14 in heat conducting relation thereto. The collector contact 14 may be a high heat conductivity aluminum alloy, and the ring 22 may also be a high heat conductivity aluminum, the combination of which forms a peripheral heat sink for the collector 15. Leads 19 and 20 are attached to the respective base 11 and ring 22.

It will be appreciated that in operation of the transistor device, heat is generated by flow of current across the emitter, base, and collector, and that this heat is relatively uniformly generated when current densities are relatively uniform. With the heat generated being dissipated by the annular ring 22, heat generated in the central portions of the device, particularly in the central area of the collector, must flow radially to the ring 22 to be dissipated therefrom. This heat flow establishes a radial temperature gradient in the collector. Since the collector saturation current varies with temperature, a higher collector saturation current is established near the central portion of the collector 15. This offsets at least in part the surface recombination bias of the $\alpha$, and extends the range of substantial linearity of alpha with increase of emitter current $Ie$. In conventionally thin wafer transistor devices, making the collector periphery cooler than its central portion likewise makes the emitter periphery cooler than its central portion. Thus the emitter current density will be larger in the center than at the periphery. Accordingly, the tendency for the charge carriers in the base to be lost by surface recombination will be proportionately reduced at high currents, and a more uniform D.C. (direct-current) current gain transistor device results.

Figures 3, 4:
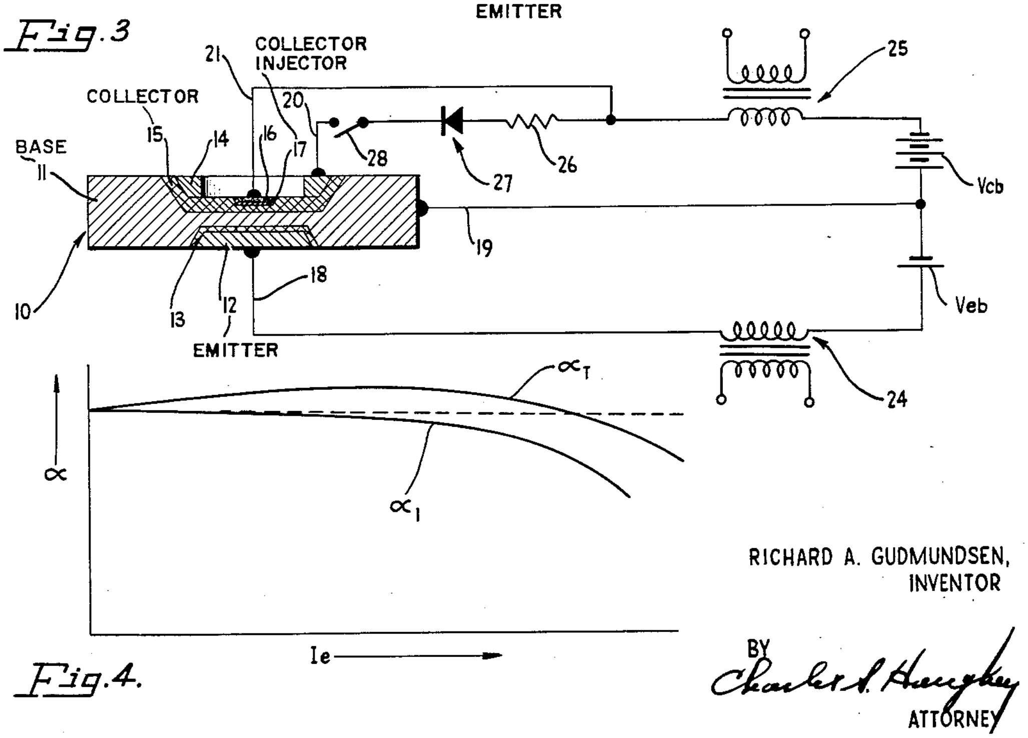
FIG. 3 is a sectional view of another alternate device together with a schematic circuit diagram for use therewith.
FIG. 4 is a diagram plotting $\alpha$ against $Ie$ showing the character of improvement in alpha for a device due to this invention.

In FIG. 4 the alpha of the transistor device is plotted against the emitter current $Ie$. The alpha is defined as $$\alpha=\left(\frac{\partial Ic}{\partial Ie}\right)Vc=\text{const.}$$

where $Ic$ is collector current, and $Vc$ is collector voltage.

The $\alpha$ for a conventional PNP, or NPN, transistor device is plotted in FIG. 4 as $\alpha 1$, showing a relatively constant $\alpha$ with increasing $Ie$, followed by a fall-off of the $\alpha$ due, as previously explained, to the effects of surface recombination loss of charge carriers at higher current densities. The curve $\alpha T$ shows the improvement resulting from this invention, with a slightly increasing $\alpha$ at low current densities, and an extended substantially constant $\alpha$ with increasing $Ie$, before eventual fall-off of the $\alpha$.

Figure 2:
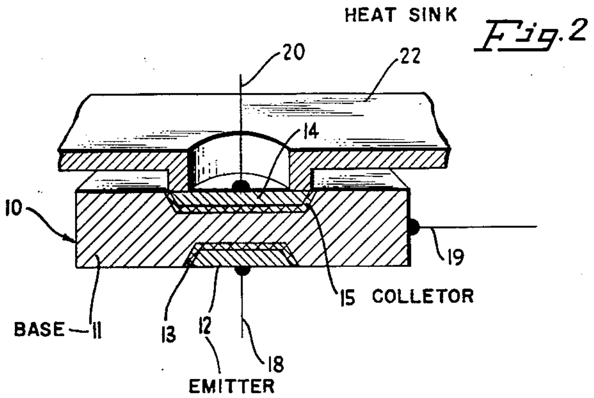
FIG. 2 is a perspective and sectional view of an alternate transistor device according to my invention.

FIG. 2 illustrates another form of the invention which is identical to FIG. 1 except that the collector contact 14 has been polished flat, leaving the metal in the central portion of the collector contact, and the collector lead 20 has been ohmically joined to the center of the contact 14. The contact 14 will ordinarily be too thin to affect the temperature distribution across the contact area. Because of the higher collector center temperatures in the devices of FIGS. 1 and 2, these are sometimes called "hot spot" collectors.

In FIG. 3 a transistor 10 is shown having an N-type (antimony doped) silicon base 11, an emitter 13 of predominantly P-type (aluminum doped) silicon, an emitter contact 12 of the aluminum alloy, and a lead 18 ohmically connected to the contact 12. A predominantly P-type (aluminum doped) silicon collector 15 on the opposite side of the base from the emitter, and somewhat larger in area, was initially formed in the same manner as the emitter, but the central portion of the collector contact button has been removed, as by etching, to form an annular collector contact 14 in ohmic contact with the collector 15. A lead 20 is ohmically connected to the collector contact 14. Thus far this duplicates the previously described structure of the FIG. 1 device.

Superimposed on the collector 15, according to this invention, is a collector-injector 17 of predominantly N-type, in which the silicon crystal may be very heavily doped with an N-type impurity such as antimony, with an ohmically connected injector contact 16 and a lead 21 ohmically connected to the contact 16.

As shown in the circuit of FIG. 3, the transistor 10 is base grounded, with a base lead 19 ohmically connected to the base 11. A small voltage developed by a voltage source $Veb$ is connected through a transformer 24 between the base lead 19 and the emitter lead 18. A relatively larger voltage developed by a voltage source $Vcb$ is connected through a second transformer 25 between the base lead 19 and the collector-injector lead 20. An intermediate potential between that of the base and that of the collector-injector is maintained at the collector lead 20, for example by a unilaterally conducting device such as a diode 27 and a resistor 26 connected through a switch 28 between leads 20 and 21. This effectively maintains a unidirectional potential change from emitter to base to collector to injector.

If the circuit of FIG. 3 is considered with the switch 28 open, the circuit appears to be a conventional multiplying collector, or hook, PNPN type transistor device. The alpha for the device as a whole, $\alpha T$, is the current gain for the hook device and may be expressed as $$\alpha T=\frac{\alpha 1}{1-\alpha 2}$$

where $\alpha 1$ is the current gain from the emitter to the collector 15, and $\alpha 2$ is the current gain from the collector-injector 17 to the collector 15. $\alpha T$ can thus be greater than 1. It should be noted, however, that with the transistor device of FIG. 3 (switch 28 open) there is a transfer of current radially through the base because the central collector-injector 17 injects charge carriers across the collector 15 to the base in the center thereof, which produces exactly the effect of the increased collector current at the center of the "hot spot" collector of FIGS. 1 and 2, increasing the linearity of the alpha as shown by the curve $\alpha T$ in FIG. 4.

With the switch 28 closed in FIG. 3, the net alpha, $\alpha T$, of the device is modified by the fraction of the collector current which is multiplied by the hook collector-injector 17, and by use of the proper network between the collector lead 20 and the collector-injector lead 21, the net device alpha $\alpha T$ may be varied from less than 1 to greater than 1.

Considering the circuit of FIG. 3 with switch 28 closed, we may consider collector 15 to be a by-pass collector and collector-injector 17 to be a multiplying collector. The total collector current $Ic$ then equals the by-pass collector current $Icb$ plus the multiplying collector current $Icm$, or $$Ic=Icb+Icm$$

If $Iod$ is diode 27 saturation current;

$Ioc$ is multiplying collector 17 diode saturation current;

R is the resistance of resistor 26;

V is the voltage across the diode 27; and $$\theta=\frac{e}{KT},$$

then $Icm=Ioc\ e^{\theta V}$, where $$V=IcbR+\frac{1}{\theta}\ln\frac{Icb}{Iod}$$

and $$Icm=Ioc\,e^{\left[\theta IcbR+\ln \frac{Icb}{Iod}\right]}$$

where the base current (in lead 19) is $Ib$, $$Ib=(1-\alpha 1)Ie-Icm\alpha 2$$

$$Icm+Icb=Ic=Ie-Ib$$

$$Ie=Icm\left(\frac{1-\alpha 2}{\alpha 1}\right)+\frac{1}{\alpha 1}Icb$$

$$\alpha T=\frac{Ic}{Ie}=\frac{Icm+Icb}{Icm\left(\frac{1-\alpha 2}{\alpha 1}\right)+\frac{1}{\alpha 1}Icb}$$

or $$\alpha T=\frac{Icb+Ioc\,e^{\left[\theta IcbR+\ln \frac{Icb}{Iod}\right]}}{\frac{Icb}{\alpha 1}+Ioc\left(\frac{1-\alpha 2}{\alpha 1}\right)e^{\left[\theta IcbR+\ln \frac{Icb}{Iod}\right]}}$$

and $$\alpha T=\alpha 1\left[\frac{Icb+Ioc\,e^{\left(\theta IcbR+\ln \frac{Icb}{Iod}\right)}}{Icb+Ioc(1-\alpha 2)\,e^{\left(\theta IcbR+\ln \frac{Icb}{Iod}\right)}}\right]$$

For low currents ($Ie$ small) $\alpha$T approaches $\alpha 1$, but for large currents ($Ie$ large)

$$\alpha T \text{ approaches } \left(\frac{\alpha 1}{1-\frac{\alpha 2}{1+\frac{Iod}{Ioc}}}\right)$$

Thus if $\alpha 1$ is constant at low currents, $\alpha$T increases with I$e$.

In practice, however, $\alpha 1$ is not constant, but decreases with I$e$, slightly at low I$e$. This is called alpha crowding. Thus in FIG. 4, $\alpha 1$ will drop with I$e$, even at low currents, but $\alpha$T, the total net alpha, initially increases with respect to $\alpha 1$ at increasing I$e$, and thus produces a flatter curve $\alpha$T in FIG. 4, and extends the flat portion of the curve to higher I$e$. This is the desired result for the devices of FIGS. 1, 2 and 3.

It should be noted that the modified alpha, $\alpha$T, may be tailored for a desired result by use of a proper network between leads 19, 20 and 21 of FIG. 3. A selected diode 27 may be used to primarily produce one of a family of theoretically exponentially increasing alphas, as in a hook transistor, and a selected resistance 26 may be used to change the shape of the curve toward a straight, linear $\alpha$T vis. I$e$ relation. Thus combinations of such network elements may be used to produce many varied actual $\alpha$T curves for varied requirements.

The heat sink, or hot spot, variations as taught by FIGS. 1 and 2 are simpler than the multiplying injector-collector and network control of FIG. 3, but as will be appreciated they are less versatile. The preferred form of the invention thus depends on the degree and controllability of improvement required, and the complexity of apparatus which is tolerable.

Many variations of this invention are possible by changing the geometry and circuitry thereof, as for example by changing to rectangular emitter and collector configurations for FIGS. 1 and 2; by superimposing a collector-injector according to FIG. 3 on the heat radiator configuration of FIG. 1; or by substituting a battery voltage for the diode and resistor of FIG. 3 to maintain a substantially constant relation of potential drop over junctions 15 and 17; and of course by starting with an initially P-type wafer in place of the N-type wafer.

Having disclosed the invention in its preferred forms, what is claimed is:

1. A transistor device having substantially parallel emitter to base and collector to base junctions separated by a base, and a peripheral heat radiator operatively connected to one of said junctions to lower the peripheral junction temperature with respect to the central junction temperature.

2. A transistor device having substantially parallel emitter to base and collector to base junctions separated by a base; an annular ohmic contact with said collector; and a heat radiator connected to said contact in a manner to conduct heat preferentially from the periphery thereof, whereby to reduce the peripheral junction temperature with respect to the central junction temperature.

3. A transistor device having substantially parallel emitter to base and collector to base junctions separated by a base; a peripheral ohmic contact to said collector; and an injector to collector junction in the central portion of said collector.

4. A transistor device having substantially parallel emitter to base and collector to base junctions separated by a base; a peripheral ohmic contact to said collector; a central injector to collector junction in said collector; and a bias circuit interconnecting the emitter, base, collector and injector of the device and maintaining a unidirectional potential change from emitter to base to collector to injector.

5. A transistor device according to claim 4, the bias circuit including a unilaterally conducting device connected between the collector and the base through a voltage source, and including a connection between the injector and the base through said voltage source.

6. A transistor device according to claim 4, the bias circuit including a resistance connected between the collector and the base through a voltage source.

7. A transistor device comprising a monocrystalline wafer predominantly of N-type conductivity, a predominantly P-type conductivity emitter, and a predominantly P-type conductivity collector, the emitter and collector being oppositely disposed in the wafer with substantially uniform thickness N-type base therebetween; an annular heat conductor thermically connected to the periphery of the collector; and ohmic leads connected respectively to said emitter, base and collector.

8. A transistor according to claim 7 wherein the lead to the collector is connected to the center thereof.

9. A transistor device comprising a monocrystalline wafer predominantly of N-type conductivity, having on one side thereof an emitter predominantly of P-type conductivity, having on the other side thereof a relatively larger area collector predominantly of P-type conductivity to form an N-type base therebetween, and having in the central portion only of the exterior collector surface an injector predominantly of N-type conductivity; and leads ohmically connected respectively to said emitter, base, collector and injector.

10. A transistor device according to claim 9 wherein the lead to the collector is ohmically connected through an annular ring contact adjacent the collector periphery.

11. A transistor device comprising a monocrystalline silicon wafer having an impurity concentration of antimony sufficient to form an N-type conductivity therein, having on one side of said wafer an additional impurity concentration of aluminum sufficient to form an emitter predominantly of P-type conductivity, having on the other side of said wafer a relatively larger area collector having sufficient aluminum impurity to make the collector predominantly P-type, having between said P-type collector and emitter an N-type base of substantially uniform thickness, and having in the central portion only of the exterior collector surface an injector having sufficient antimony impurity to form a predominantly N-type injector; and leads ohmically connected respectively to said emitter, base, collector and injector.

12. A transistor device according to claim 11 and further comprising an annular aluminum contact ring ohmically connected to the periphery of the collector and forming an ohmic connection from the collector to said collector lead.

13. A transistor device according to claim 11 and further comprising a bias circuit interconnecting said ohmically connected leads and maintaining unidirectional potential change from emitter to base to collector to injector.

14. A transistor device according to claim 13 wherein said bias circuit includes a P-N junction diode connected between the collector and the base, and a connection between the injector and the base, the P-side of said diode being connected to the collector.

15. In a transistor circuit, in combination: a semiconductor crystal body having an emitter, a base, and a collector and having substantially parallel emitter to base and collector to base junctions separated by a base; first circuit means for forward biasing said emitter to base junction; second circuit means for reverse biasing said collector to base junction; and means coupled to one of said junctions for reducing the collector saturation current from a central portion thereof to a peripheral portion thereof.

16. The combination according to claim 15 wherein said means coupled to one of said junctions comprises an annular heat radiator connected in heat conducting relationship to said collector in a manner to preferentially conduct heat from the peripheral portion thereof.

17. The combination according to claim 15 wherein said means coupled to one of said junctions comprises an injector, a collector to injector junction disposed in said collector in the central region only thereof, and third circuit means to bias said collector to injector junction in the forward direction toward said collector.

References Cited in the file of this patent

UNITED STATES PATENTS

| | | |
|---|---|---|
| 2,623,105 | Shockley | Dec. 23, 1952 |
| 2,725,505 | Webster et al. | Nov. 29, 1955 |
| 2,754,431 | Johnson | July 10, 1956 |
| 2,754,455 | Pancove | July 10, 1956 |
| 2,759,133 | Mueller | Aug. 14, 1956 |
| 2,770,732 | Chong | Nov. 13, 1956 |
| 2,877,359 | Ross | Mar. 10, 1959 |
| 2,889,499 | Rutz | June 2, 1959 |
| 2,895,058 | Pankove | July 14, 1959 |